(12) United States Patent
Murata

(10) Patent No.: US 7,917,245 B2
(45) Date of Patent: Mar. 29, 2011

(54) AUTOMATED MATERIAL HANDLING SYSTEM

(75) Inventor: Masanao Murata, Mie (JP)

(73) Assignee: Muratec Automation Co., Ltd., Kyoto-shi, Kyoto (JP)

( * ) Notice: Subject to any disclaimer, the term of this patent is extended or adjusted under 35 U.S.C. 154(b) by 784 days.

(21) Appl. No.: 11/887,278

(22) PCT Filed: Mar. 27, 2006

(86) PCT No.: PCT/JP2006/306194
§ 371 (c)(1),
(2), (4) Date: Sep. 27, 2007

(87) PCT Pub. No.: WO2006/104115
PCT Pub. Date: Oct. 5, 2006

(65) Prior Publication Data
US 2009/0276082 A1    Nov. 5, 2009

(30) Foreign Application Priority Data

Mar. 28, 2005    (JP) ............... P2005-091673

(51) Int. Cl.
*G05D 1/02*    (2006.01)
*B23Q 41/02*    (2006.01)
*B65G 1/00*    (2006.01)
*G05B 19/418*    (2006.01)

(52) U.S. Cl. ......... 700/224; 700/226; 700/110; 700/115
(58) Field of Classification Search .................. None
See application file for complete search history.

(56) References Cited

FOREIGN PATENT DOCUMENTS

| JP | 2-23103 | 1/1990 |
| JP | 9-283595 | 10/1997 |
| JP | 2000-255714 | 9/2000 |
| JP | 2002-182743 | 6/2002 |
| JP | 2002182743 A * | 6/2002 |
| JP | 2003-76422 | 3/2003 |
| JP | 2005-1886 | 1/2005 |

* cited by examiner

*Primary Examiner* — Gene Crawford
*Assistant Examiner* — Yolanda Cumbess
(74) *Attorney, Agent, or Firm* — Drinker Biddle & Reath LLP

(57) ABSTRACT

Objects to be transported which are transported between at least one storage unit and a plurality of manufacturing apparatuses by a plurality of transport vehicles in accordance with a command of a controller are managed inexpensively and easily and with high reliability. An ID card 20 incorporating a wireless communication function is installed on all carriers 18, and an ID read/write unit 25 is installed in some transport vehicles 10. Further, a carrier ID is read or written with respect to the ID card 20 in accordance with a command of an MCS 4 connected to the ID read/write unit 25, so as to manage the carrier ID by a carrier ID management unit 4*a*.

2 Claims, 5 Drawing Sheets

AUTOMATED MATERIAL HANDLING SYSTEM

TECHNICAL FIELD

The present invention relates to an automated material handling system for managing objects to be transported which are transported between at least one storage unit and a plurality of manufacturing apparatuses by a plurality of transport vehicles in accordance with a command of a controller.

BACKGROUND ART

In manufacturing plants of such as semiconductors and liquid crystals, an automated material handling system (AMHS) is used in which, since fine particulate dust and the like in the air adversely affect the quality performance of products, articles in the manufacturing process (e.g., in the case of a semiconductor product manufacturing facility, semiconductor substrates and glass substrates for liquid crystal displays, glass substrates for photomasks, and intermediate products of articles to be manufactured such as substrates for optical disks) are accommodated in a cassette, and are transported between a manufacturing apparatus and a storage unit such as a stocker or a simplified buffer unit by a transport system in accordance with a manufacturing process (refer to patent document 1). It should be noted that transport systems based on transport vehicles which travel on a track, including an OHT (Overhead Hoist Transport) system and an OHS (Over Head Shuttle) system for transporting an FOUP (Front Opening Unified Pod) by traveling on a track suspended from a ceiling and a transport system using transport vehicles which autonomously travel on a floor, are a mainstream as the transport systems.

In addition, in the automated material handling system, a carrier ID (a barcode, an RFID (Radio Frequency Identification), an infrared communication ID, etc.) which is identification information for identifying the carrier is attached to each of the carriers which are objects to be transported. When the carrier is transferred by a transport vehicle to a manufacturing apparatus or a storage unit, such as a stocker, a buffer stage, and a simplified buffer unit installed in parallel to a transport path, ID read/write units are respectively installed in their loading ports and unloading ports or interface unit portions of the two ports, and the confirmation of the carrier ID and the reading and writing of the carrier ID which is managed are carried out by a controller of the automated material handling system through this ID read/write unit.

For example, patent document 2 discloses a technique in which a wireless communication function connected to a host computer is installed at respective portions of manufacturing apparatuses and storage units, such as stockers, buffer stages, and simplified buffer units, while electronic modules having a wireless communication function and capable of storing predetermined information (identification information) are respectively mounted on cassettes (objects to be transported), and predetermined information is read from or written into the electronic module by wireless communication to thereby manage the cassettes by the host computer.
[Patent Document 1] JP-A-2005-1886
[Patent Document 1] JP-A-9-283595

However, since the ID read/write units are expensive, in the case where the numbers of manufacturing apparatuses and storage units, such as stockers, buffer stages, and simplified buffer units installed in parallel to the transport path are large, there is a problem in that the cost becomes high.

In addition, in the case where the reading and writing of identification information on the object to be transported are performed by using the wireless communication technology, there is a problem in that the setting of installation sites of the wireless communication function is difficult owing to the directivity of the antenna used in the wireless communication technology. Namely, if the object to be transported enters a dead zone in a wireless communicable range (e.g., the object to be transported deviates from a proper position), wireless communication cannot be established, and therefore there is a problem in that the object to be transported and the identification information on the object to be transported cannot be confirmed. At that juncture, to confirm the object to be transported and the identification information on the object to be transported, the automated material handling system must be stopped and the identification information must be manually read from the ID read/write units with respect to all the objects to be transported. In a case where the number of carriers is large, labor and time are involved, and since the production process is stopped for a long time, the productivity of the manufacturing plant is unfavorably affected.

DISCLOSURE OF THE INVENTION

Problems that the Invention is to Solve

In view of the above-described conventional problems, in accordance with the invention an automated material handling system is provided in which objects to be transported which are transported between at least one storage unit and a plurality of manufacturing apparatuses by a plurality of transport vehicles in accordance with a command of a controller are managed inexpensively and easily and with high reliability.

Means for Solving the Problems

An automated material handling system according to the invention is an automated material handling system for managing objects to be transported which are transported between at least one storage unit and a plurality of manufacturing apparatuses by a plurality of transport vehicles in accordance with a command of a controller, characterized in that: the object to be transported has a readable/writable identification information recording unit for recording identification information for identifying an object to be processed which is accommodated in the object to be transported; some of the transport vehicles each has an identification information read/write unit for effecting the reading and writing of the identification information with respect to the identification information recording unit based on the command of the controller; and the controller has an identification information management unit for storing and managing the identification information which has been read or written in the identification information read/write unit, wherein the management of the object to be processed is performed in the controller based on the identification information recorded on the identification information recording unit and the identification information stored in and managed by the identification information management unit.

Accordingly, the identification information read/write unit, which performs, based on a command of the controller, the reading and writing of identification information on or from the identification information recording unit mounted on an object to be transported, is mounted only on some transport vehicles. Therefore, a marked cost reduction is achieved in comparison with the conventional case where the identification information read/write unit is mounted in all of the manufacturing apparatuses and the storage units. In addition, since the identification information read/write unit is mounted in the transport vehicle, the transport vehicle is able to read and write the identification information while performing the usual transporting operation, so that the objects to be transported can be managed easily. Furthermore, the transport vehicle excels in mobility with respect to the manufacturing apparatuses and the storage units and readily ensures communication between the identification information read/write unit mounted in the transport vehicle and the identification information recording unit mounted on the object to be transported, thereby making it possible to manage the objects to be transported with high reliability. It should be noted that, in the invention, an identification information read/write unit using a conventional communication unit employing the principle of light and radio is used as the identification information read/write unit.

Here, the identification information read/write unit may read the identification information from the identification information recording unit at a time of performing the carrying in and out of the object to be transported with respect to the storage unit and the manufacturing apparatuses, and the controller may further have an identification information confirmation unit for confirming whether or not the identification information read by the identification information read/write unit and the identification information stored in and managed by the identification information management unit match.

Accordingly, each time the transport vehicle with the identification information read/write unit mounted therein performs the carrying in and out of the object to be transported with respect to the storage unit and the manufacturing apparatus, confirmation is made as to whether or not the identification information read from the identification information recording unit of the object to be transported and the identification information stored in and managed by the identification information management unit match. Therefore, the occurrence of a problem can be detected at an early stage by frequently confirming the identification information concerning the objects to be transported, so that it is possible to improve the reliability of management of the objects to be transported.

In addition, the identification information read/write unit may read the identification information from the identification information recording unit at a time of performing the carrying in and out of the object to be transported with respect to the storage unit and the manufacturing apparatuses in which the identification information read/write unit has not been installed, and the controller may further have an identification information confirmation unit for confirming whether or not the identification information read by the identification information read/write unit and the identification information stored in and managed by the identification information management unit match.

Accordingly, as for the storage units and the manufacturing apparatuses where the identification information read/write units have already been installed, a conventional technique using the installed identification information read/write units is made use of, whereas, as for the storage units and the manufacturing apparatuses where the identification information read/write units are not installed, the transport vehicles with the identification information read/write unit mounted therein are used. Accordingly, the cost can be reduced since it is unnecessary to newly install the identification information read/write units while using existing facilities. Further, as for the storage units and the manufacturing apparatuses where the identification information read/write units are not installed, each time the transport vehicle with the identification information read/write unit mounted therein performs the carrying in and out of the object to be transported, confirmation is made as to whether or not the identification information read from the identification information recording unit of the object to be transported and the identification information stored in and managed by the identification information management unit match. Therefore, the occurrence of a problem can be detected at an early stage by frequently confirming the identification information concerning the object to be transported as for the storage units and the manufacturing apparatuses where the identification information read/write units are not installed, so that it is possible to further improve the reliability of management of the objects to be transported.

Here, when it is determined in the identification information confirmation unit that the identification information read by the identification information read/write unit and the identification information stored in and managed by the identification information management unit do not match, the controller may cause the identification information stored in and managed by the identification information management unit to be rewritten into the identification information read by the identification information read/write unit, or may rearrange the object to be transported so as to match the identification information stored in and managed by the identification information management unit.

ADVANTAGES OF THE INVENTION

Accordingly, in cases such as where a disturbance has occurred in data due to a system trouble, when mismatching has been detected by the identification information confirmation unit between the identification information stored in and managed by the identification information management unit and the identification information read by the identification information read/write unit, the automated material handling system is, for instance, temporarily stopped, and the transport vehicle with the identification information read/write unit installed therein is made to automatically travel so as to go around the manufacturing apparatuses and the storage units to read the identification information on all the objects to be transported or the objects to be transported on the manufacturing apparatuses and the storage units where the identification information read/write units are not installed, and the identification information stored in and managed by the identification information management unit is rewritten on the basis of the identification information which has been read. Alternatively, each object to be transported is rearranged so as to match the identification information stored in and managed by the identification information management unit. Accordingly, it is possible to minimize the problem and restart the automated material handling system at an early stage, thereby making it possible to further improve the reliability of management of the objects to be transported.

Figure 1:
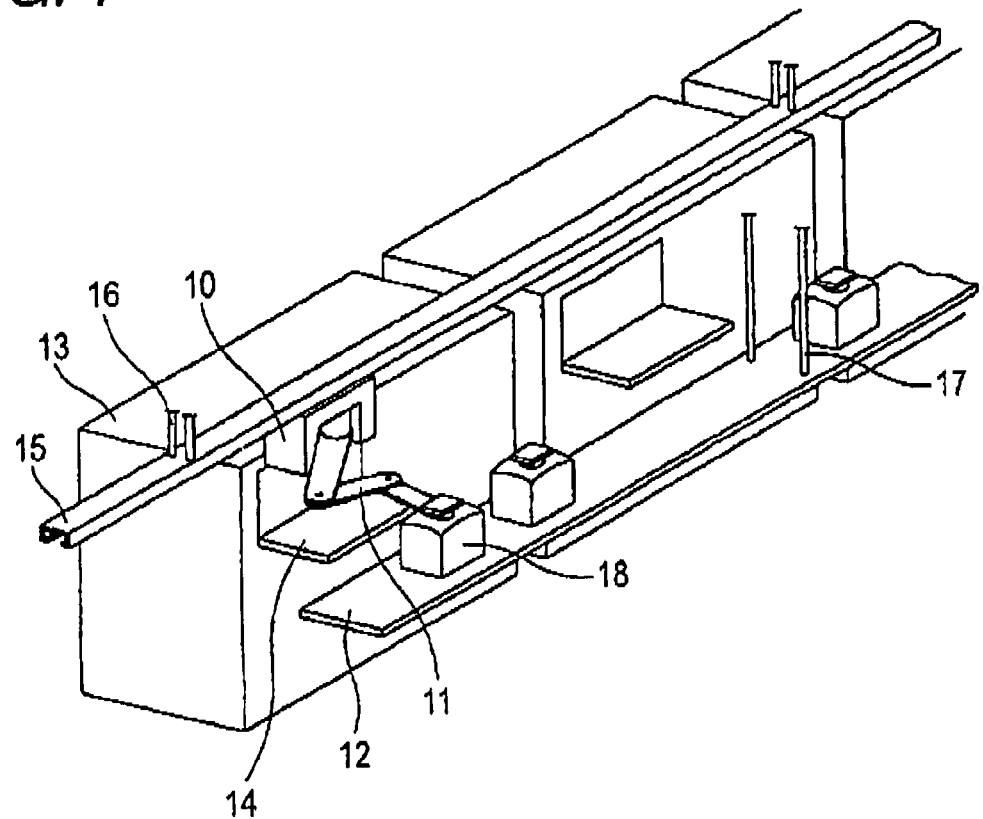
FIG. 1 is a schematic perspective view of the automated material handling system in accordance with this embodiment including OHT transport vehicles, simplified buffer units, and manufacturing apparatuses.

DESCRIPTION OF REFERENCE NUMERALS AND SIGNS 1 automated material handling system
2 storage unit
4 MCS (controller)
4a carrier ID management unit (identification information management unit)
4b carrier ID confirmation unit (identification information confirmation unit)
10 OHT transport vehicle (transport vehicle)
12 simplified buffer unit (storage unit)
13 semiconductor manufacturing apparatus (manufacturing apparatus)
18 carrier (object to be transported)
20 ID card (identification information recording unit)
25 ID read/write unit (identification information read/write unit)

BEST MODE FOR CARRYING OUT THE INVENTION

Referring now to the drawings, a description will be given of the best mode for carrying out an automated material handling system in accordance with the invention by citing a specific example.

Figure 2:
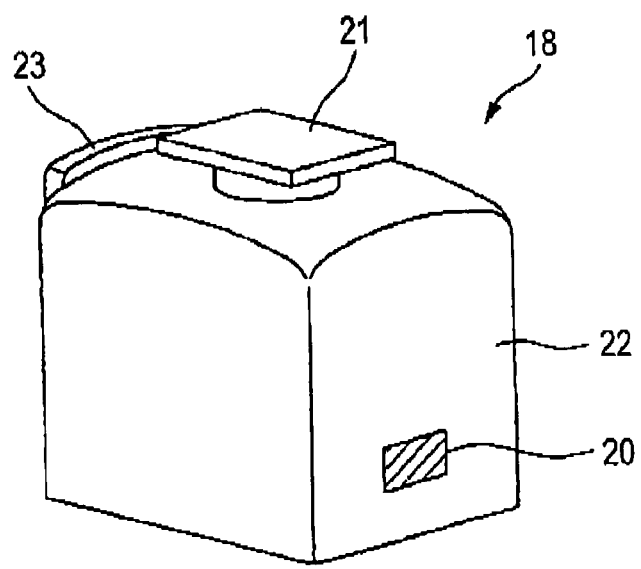
FIG. 2 is a schematic perspective view illustrating the structure of a carrier.
Figure 3:
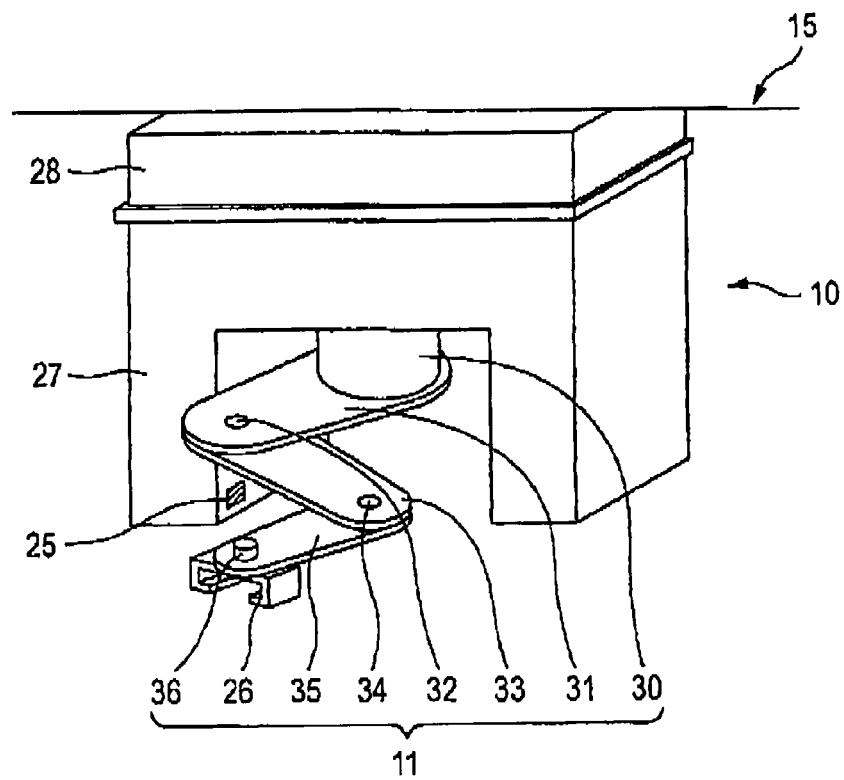
FIG. 3 is a schematic perspective view illustrating the structure of the OHT transport vehicle.
Figure 4:
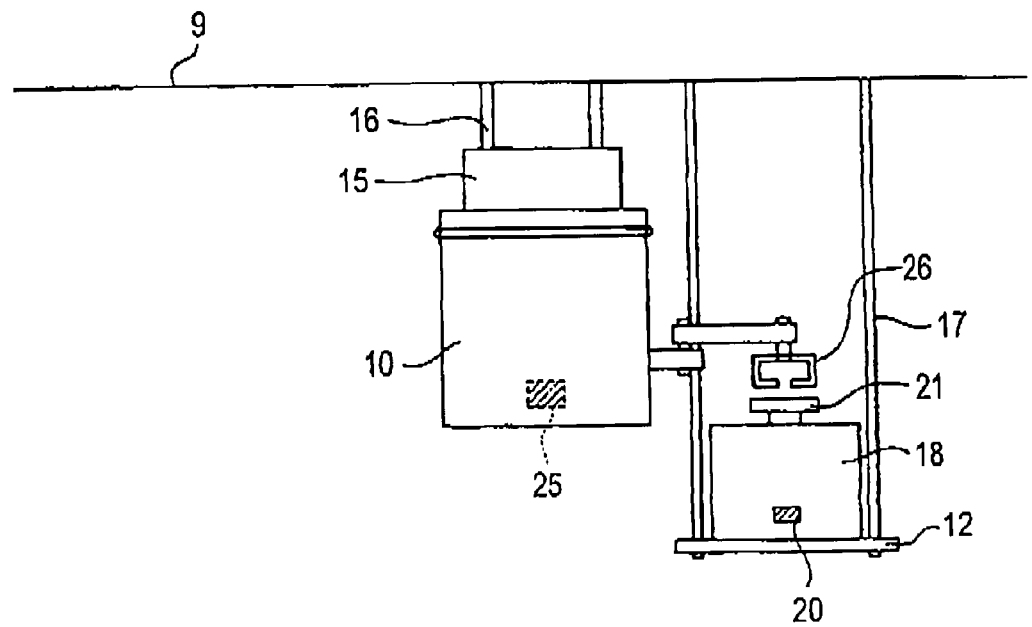
FIG. 4 is a side elevational view of the OHT transport vehicle, the simplified buffer unit, and the carrier in a state in which the OHT transport vehicle is loading or unloading the carrier onto or from the simplified buffer unit.
Figure 5:
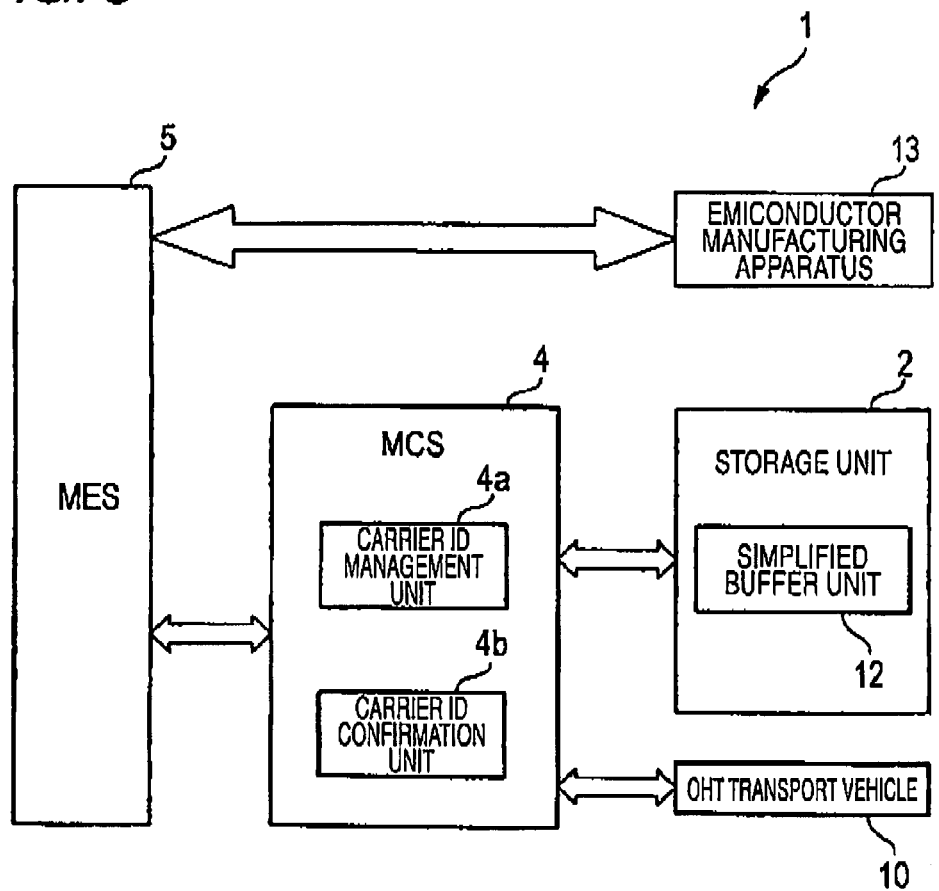
FIG. 5 is a block diagram of the automated material handling system in accordance with this embodiment.
Figure 6:
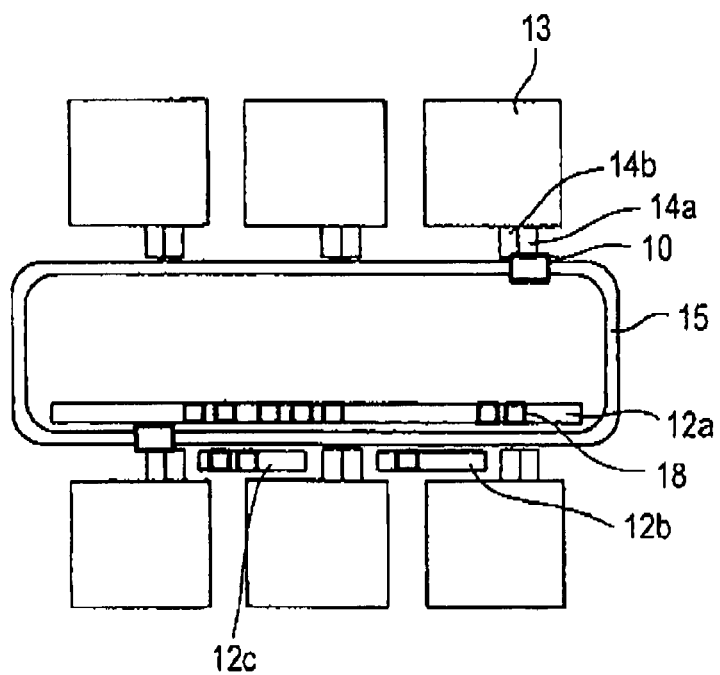
FIG. 6 is a top view illustrating the configuration of the automated material handling system including the OHT transport vehicles, a track of the OHT transport vehicle, the simplified buffer units, and the manufacturing apparatuses.

Referring to FIGS. 1 to 6, a description will be given of the automated material handling system in accordance with this embodiment. FIG. 1 is a schematic perspective view of the automated material handling system in accordance with this embodiment including OHT transport vehicles, simplified buffer units, and manufacturing apparatuses. FIG. 2 is a schematic perspective view illustrating the structure of a carrier. FIG. 3 is a schematic perspective view illustrating the structure of the OHT transport vehicle. FIG. 4 is a side elevational view of the OHT transport vehicle, the simplified buffer unit, and the carrier in a state in which the OHT transport vehicle is loading or unloading the carrier onto or from the simplified buffer unit. FIG. 5 is a block diagram of the automated material handling system in accordance with this embodiment. FIG. 6 is a top view illustrating the configuration of the automated material handling system including the OHT transport vehicles, a track of the OHT transport vehicle, the simplified buffer units, and the manufacturing apparatuses.

As shown in FIGS. 1 and 6, an OHT transport vehicle (transfer robot) 10, which travels on a rail (track) 15 attached to a ceiling 9 by means of rail suspending members 16, automatically transports a carrier (object to be transported) 18 with a substrate accommodated therein between semiconductor manufacturing apparatuses (manufacturing apparatuses) 13 in accordance with a manufacturing process, i.e., in accordance with commands of an MES (Manufacturing Execution System) 5 and an MCS (Material Control System) 4, so as to perform the carrying in and out of the carrier 18 through a loading port 14a and an unloading port 14b. In addition, at the time of transport, the carrier 18 is temporarily stored, as required for process adjustment, on a simplified buffer unit (storage unit) 12 disposed on either side (12a, 12b, and 12c in FIG. 6) of the rail 15 of the transport vehicle and attached to the ceiling 9 by means of buffer suspending members 17. It should be noted that the simplified buffer unit 12 can be supported not only on the ceiling 9 but also on a wall surface and a floor surface. Here, in this embodiment, it is assumed that ID read/write units have already been installed on the semiconductor manufacturing apparatuses 13 and stockers (not shown), and that the management of ID data is carried out in accordance with a conventional technique. And yet, the ID read/write unit is not installed on the simplified buffer unit 12.

As shown in FIG. 2, the carrier (FOUP) 18 accommodates the substrate, i.e., an article to be processed, in a substrate accommodating portion 22 having an openable lid 23, and is transported as a flange 21 provided on an upper surface of the substrate accommodating portion 22 is gripped by the OHT transport vehicle 10. In addition, an ID card (identification information recording unit) 20 is installed on a side surface of the substrate accommodating portion 22. It should be noted the ID card 20 is installed on all the carriers 18. Here, the ID card 20 is a readable/writable data storage medium capable of recording carrier ID (identification information, such as information concerning the substrate accommodated in each carrier 18 and information concerning progress in the processing process of the carrier 18), and should preferably be detachable. In addition, the ID card 20 has a wireless communication function, and is adapted to be able to perform wireless communication with an ID read/write unit (identification information read/write unit) 25 incorporating a wireless communication function and installed in the OHT transport vehicle 10 which will be described later. Further, a carrier ID transmitted from the below-described ID read/write unit 25 is written on the ID card 20, and the ID card 20, in turn, transmits a carrier ID to the below-described ID read/write unit 25 so as to be read by the ID read/write unit 25. It should be noted that the ID card 20 may be installed not only at the position shown in FIG. 2 but at any position on the carrier 18 insofar as it is a position allowing communication with the ID read/write unit 25 installed in the below-described OHT transport vehicle 10.

As shown in FIG. 3, the OHT transport vehicle 10 is installed in such a manner as to be capable of traveling on the rail 15 by means of a positioning mechanism 28, and has mounted thereon a transfer robot 11 installed so as to be capable of being accommodated in a transport vehicle body 27 and having a rotating/lifting function. The transfer robot 11 is constituted by a first-stage arm 31 connected to a rotatable and liftable rotating/lifting shaft 30, a second-stage arm 33, a third-stage arm 35, and a gripper portion 26. Here, the first-stage arm 31 and the second-stage arm 33 are connected to each other at a leading end of the first-stage arm 31 through a pivot shaft 32; the second-stage arm 33 and the third-stage arm 35 are connected to each other at a leading end of the second-stage arm 33 through a pivot shaft 34; and the third-stage arm 35 and the gripper portion 26 are connected to each other at a leading end of the third-stage arm 35 through a pivot shaft 36. Further, the OHT transport vehicle 10 rotates and raises or lowers the first-stage arm 31, the second-stage arm 33, and the third-stage arm 35 of the transfer robot 11, and grips the flange 21 of the carrier 18 by the gripper portion 26. For example, as shown in FIG. 4, when the carrier 18 is loaded onto the simplified buffer unit 12, as the first-stage arm 31, the second-stage arm 33, and the third-stage arm 35 of the transfer robot 11 are rotated and raised or lowered, the gripper portion 26 gripping the flange 21 of the carrier 18 is moved so as to be positioned above the simplified buffer unit 12. After the carrier 18 is placed on the simplified buffer unit 12, the grip of the gripper portion 26 with respect to the flange 21 of the carrier 18 is released. On the other hand, when the carrier 18 is unloaded from the simplified buffer unit 12, as the first-stage arm 31, the second-stage arm 33, and the third-stage arm 35 of the transfer robot 11 are rotated and raised or lowered, the gripper portion 26 is moved so as to be positioned above the carrier 18 of the simplified buffer unit 12. After the carrier 18 is placed on the simplified buffer unit 12, the flange 21 of the carrier 18 is gripped by the gripper portion 26, and the transfer robot 11 is then accommodated in the transport vehicle body 27. It should be noted that, when the OHT transport vehicle 10 travels, the transfer robot 11 is accommodated in the transport vehicle body 27 so as to prevent a collision with another facility.

In addition, the ID read/write unit 25 is provided on an inner side surface portion of the transport vehicle body 27 at a position opposing the transfer robot 11 and opposing the ID card 20 in a state in which the transfer robot 11 is accommodated in the transport vehicle body 27. It should be noted that ID read/write unit 25 is installed in some of the OHT transport vehicles 10. In addition, the ID read/write unit 25 has a wireless communication function and is capable of performing wireless communication with the ID card 20. Further, the ID read/write unit 25 is connected to the below-described MCS 4, and on the basis of a command from the below-described MCS 4 the ID read/write unit 25 transmits to the ID card 20 a carrier ID to be written and receives from the ID card 20 a carrier ID to be read. It should be noted that the ID read/write unit 25 may be installed not only at the position shown in FIG. 3 but at any position on the OHT transport vehicle 10 insofar as it is a position allowing communication with the ID card 20.

As shown in FIG. 5, in this automated material handling system 1, communication concerning commands, reports, and the like is carried out among the MES (Manufacturing Execution System) 5 which is a manufacturing execution system, the MCS (Material Control System) 4 which is a handling control system (controller), the semiconductor manufacturing apparatuses 13, the OHT transport vehicles 10 which are a transport system, the simplified buffer units 12, and storage units 2 each having an unillustrated stocker.

The MES 5 is an information processing system for progress management of a semiconductor manufacturing line and automation of production, includes the functions of a scheduler and a dispatcher, receives a status report of a port (such as a deliverability report and a delivery completion report) from the semiconductor manufacturing apparatus 13, and executes such as a port appointment and a delivery instruction with respect to the semiconductor manufacturing apparatus 13.

The MCS 4 accepts a transport command from the MES 5 and issues an instruction accordingly so that each of the OHT transport vehicle 10 and the storage unit 12 organically operates to execute the transport command received from the MES 5. Further, the MCS 4 monitors the status of the OHT transport vehicle 10 and the storage unit 12. In addition, the MCS 4 includes a carrier ID management unit (identification information management unit) 4a and a carrier ID confirmation unit (identification information confirmation unit) 4b. The carrier ID management unit 4a is for storing and managing transport destination data outputted from the MES 5 to each carrier in correspondence with its carrier ID. The carrier ID confirmation unit 4b is for confirming whether or not the carrier ID read from the ID card 20 through the ID read/write unit 25 and the carrier ID stored in and managed by the carrier ID management unit 4a match each time the OHT transport vehicle 10 loads and unloads the carrier 18 onto or from the simplified buffer unit 12.

Further, in a case where the carrier ID read from the ID card 20 through the ID read/write unit 25 and the carrier ID stored in and managed by the carrier ID management unit 4a do not match, the automated material handling system 1 is stopped (i.e., the MCS 4 is stopped), the OHT transport vehicle 10 with the ID read/write unit 25 installed therein is made to go around the simplified buffer units 12 to read the carrier IDs from the ID cards 20 of all the carriers 18 placed on the simplified buffer units 12 through the ID read/write unit 25, and after the carrier IDs stored in and managed by the carrier ID management unit 4a are rewritten into the carrier IDs which have been read, the automated material handling system 1 is restarted (i.e., the MCS 4 is restarted). Alternatively, in the case where the carrier ID read from the ID card 20 through the ID read/write unit 25 and the carrier ID stored in and managed by the carrier ID management unit 4a do not match, the automated material handling system 1 is stopped (i.e., the MCS 4 is stopped), each carrier is rearranged so as to match the carrier ID stored in and managed by the carrier ID management unit 4a, whereupon the automated material handling system 1 is restarted (i.e., the MCS 4 is restarted).

It should be noted that the semiconductor manufacturing apparatuses 13 include process apparatuses for physically and chemically processing objects to be processes such as substrates, as well as measuring apparatuses for measuring the objects to be processed (in the case of substrates, for measuring the thickness, specific resistance, dimensions of the pattern, the number of dust particles, etc.).

Thus, according to the automated material handling system 1 in accordance with this embodiment, the ID read/write unit 25, which performs on the basis of a command of the MCS 4 the reading and writing of the carrier ID on or from the ID card 20 mounted on the carrier 18, is mounted only on some OHT transport vehicles 10. Therefore, a marked cost reduction is achieved in comparison with the conventional case where the ID read/write unit 25 is mounted in all of the semiconductor manufacturing apparatuses 13 and the storage units 2.

In addition, the ID read/write unit 25 is mounted in the OHT transport vehicle 10. Accordingly, the OHT transport vehicle 10 is able to read and write the carrier ID while performing the usual transporting operation, so that the carriers 18 can be managed easily.

In addition, the OHT transport vehicle 10 excels in mobility with respect to the semiconductor manufacturing apparatuses 13 and the storage units 12 and readily ensures communication between the ID read/write unit 25 mounted in the OHT transport vehicle 10 and the ID card 20 mounted on the carrier 18, thereby making it possible to manage the carriers 18 with high reliability.

In addition, as for the storage units 2 (storage units excluding the simplified butter units 12) and the semiconductor manufacturing apparatuses 13 where the ID read/write units have already been installed, a conventional technique using the installed ID read/write units is made use of, whereas, as for the simplified buffer units 12, the OHT transport vehicles 10 with the ID read/write unit 25 mounted therein are used.

Accordingly, the cost can be reduced since it is unnecessary to newly install the ID read/write units 25 on the simplified buffer units 12 while using the existing facilities.

Further, as for the simplified buffer unit 12, each time the OHT transport vehicle 10 with the ID read/write unit 25 mounted therein performs the carrying in and out of the carrier 18, confirmation is made in the carrier ID confirmation unit 4b of the MCS 4 as to whether or not the carrier ID read from the ID card 20 of the carrier 18 and the carrier ID stored in and managed by the carrier ID management unit 4a match. Therefore, the occurrence of a problem can be detected at an early stage by frequently confirming the carrier ID concerning the carrier 18 as for the simplified buffer unit 12, so that it is possible to further improve the reliability of management of the carriers 18.

In addition, in cases such as where a disturbance has occurred in data due to a system trouble, when mismatching has been detected by the carrier ID confirmation unit 4b of the MCS 4 between the carrier ID stored in and managed by the carrier ID management unit 4a and the carrier ID read from the ID card 20, the automated material handling system 1 is temporarily stopped, and the OHT transport vehicle 10 with the ID read/write unit 25 installed therein is made to automatically travel so as to go around the simplified buffer units 12 to read the carrier IDs of the carriers 18 placed on the simplified buffer units 12, and the carrier IDs stored in and managed by the carrier ID management unit 4a are rewritten on the basis of the carrier IDs which have been read. Alternatively, each carrier is rearranged so as to match the carrier ID stored in and managed by the carrier ID management unit 4a. Accordingly, it is possible to minimize the problem and restart the automated material handling system 1 at an early stage, thereby making it possible to further improve the reliability of management of the carriers 18.

As described above, the invention is described in the foregoing preferred embodiment, but the invention is not limited to the same. It will be appreciated that various other embodiments may be implemented without departing from the spirit and scope of the invention. Furthermore, the operation and effects based on the construction of the invention have been described in this embodiment, the operation and effects are illustrative and do not limit the invention. In addition, the specific example is illustrative of the construction in accordance with the invention and does not limit the invention.

In the automated material handling system 1 in accordance with this embodiment, the OHT transport vehicles 10 are used as the transport system, but the transport system is not limited to the same. For example, it is possible to use various transport systems such as OHS transport vehicles, AGV transport vehicles, and RGV transport vehicles.

In addition, in the automated material handling system 1 in accordance with this embodiment, the ID read/write unit 25 and the ID card 20 are adapted to carry out communication by using a wireless communication function, but the invention is not limited to the same. For example, it is possible to use a conventional communication unit using the principle of light.

Figure 7:
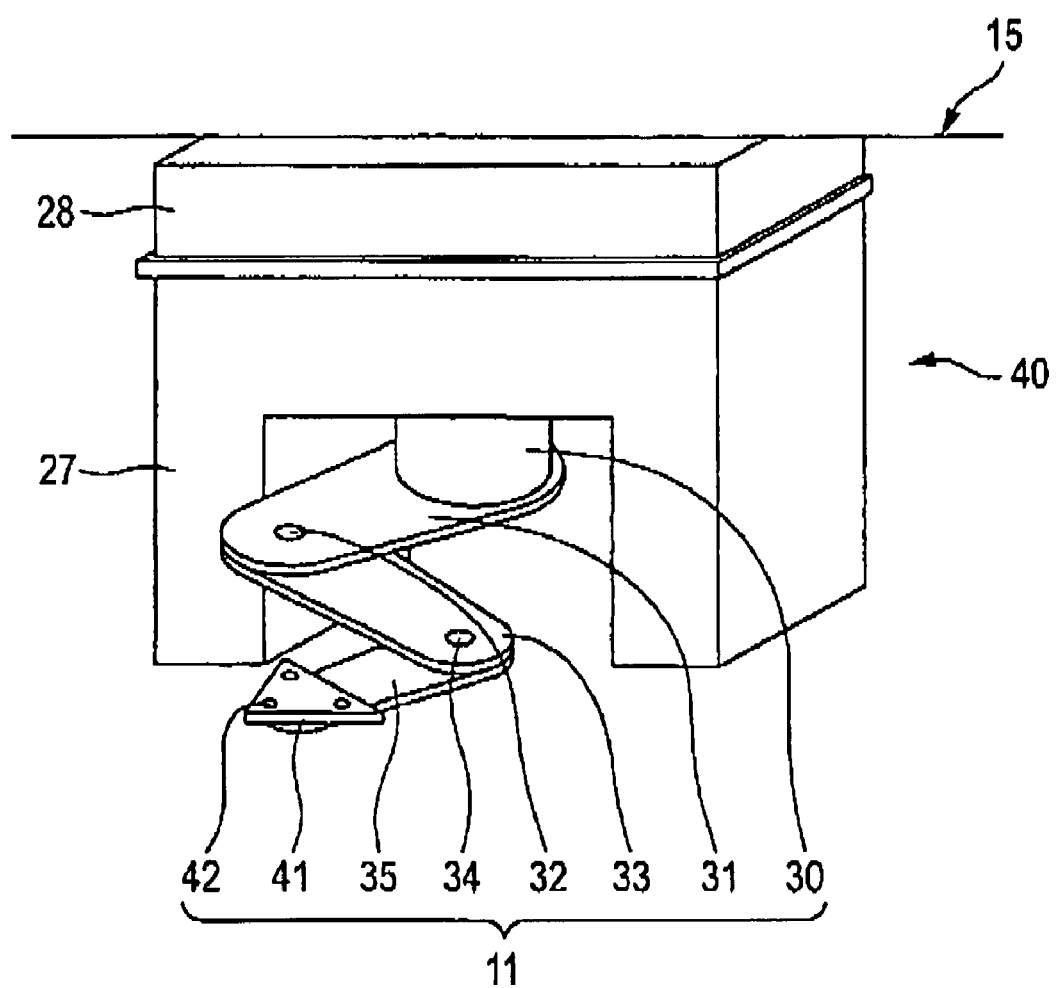
FIG. 7 is a schematic perspective view illustrating a modification of the structure of the OHT transport vehicle.

In addition, in the automated material handling system 1 in accordance with this embodiment, the OHT transport vehicle 10 is one which effects the loading and unloading by gripping the flange 21 of the carrier 18 by the gripper portion 26 of the transfer robot 11, but the OHT transport vehicle 10 is not limited to the same. For example, as shown in FIG. 7, the OHT transport vehicle 10 is one which, instead of the gripper portion 26 and the pivot shaft 36, a carrier supporting member 41 is constructed at the leading end of the third-stage arm 35 of the transfer robot 11 of the OHT transport vehicle 10 so as to scoop up the bottom surface of the carrier 18 by this carrier supporting member 41 to carry out the loading and unloading. It should be noted that protruding kinematic pins 42 fitting into recesses provided in the bottom surface of the carrier 18 are provided on the upper surface of the carrier supporting member 41 so as to function to make reliable the alignment between the carrier 18 and the transfer robot 11 and to prevent the slippage between the carrier 18 and the transfer robot 11.

Figure 8:
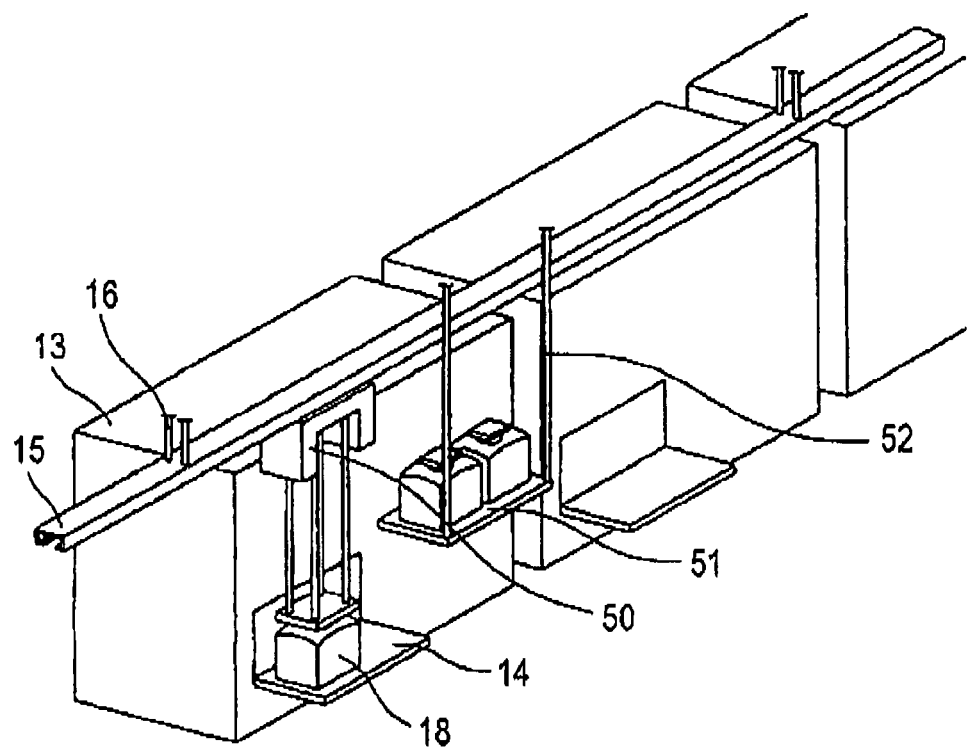
FIG. 8 is a schematic perspective view illustrating a modification of the automated material handling system in accordance with this embodiment including the OHT transport vehicle, the simplified buffer unit, and the manufacturing apparatus.
Figure 9:
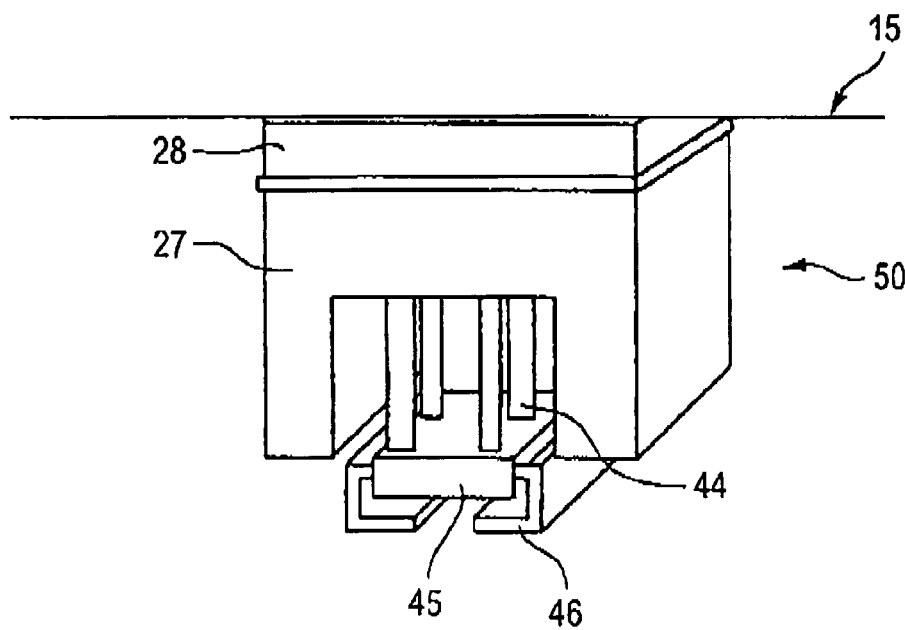
FIG. 9 is a schematic perspective view illustrating a modification of the structure of the OHT transport vehicle.

In addition, in the automated material handling system 1 in accordance with this embodiment, the simplified buffer units 12 which are not provided with the ID read/write unit are provided on both sides of the rail 15, the invention is not limited to the same. For example, as shown in FIG. 8, the simplified buffer unit may be a simplified buffer unit 51 which is located immediately below the rail 15 and suspended from and supported by the ceiling 9 by means of buffer suspending members 52. It should be noted that the simplified buffer unit 51 can be supported not only by the ceiling but also on the rail, the wall surface, or the floor surface. In such a case, the structure of the OHT transport vehicle 10 is not limited to the structure having the transfer robot 11 shown in FIG. 3, and may be a structure in which the flange 21 of the carrier 18 is clamped and gripped by a gripper 46 provided on both sides of a lifting body 45 capable of being raised and lowered in a vertical direction by suspending belts 44, as shown in FIG. 9.

In addition, in the automated material handling system 1 in accordance with this embodiment, the invention is applied only to the simplified buffer units 12, and with respect to the semiconductor manufacturing apparatuses 13 and the storage units 2 excluding the simplified buffer units 12, the management of loading and unloading of the carrier 18 with respect to them is carried out on the basis of the already installed ID read/write units in accordance with the conventional technique, but the invention is not limited to the same. For example, the invention may be applied to the management of loading and unloading of the carrier 18 with respect to the semiconductor manufacturing apparatuses 13 and all the storage units 2 including the simplified buffer units 12. Namely, the ID read/write units may not be installed on the semiconductor manufacturing apparatuses 13 and all the storage units 2 including the simplified buffer units 12, and at the time of the loading and unloading of the carrier 18 with respect to the semiconductor manufacturing apparatuses 13 and all the storage units 2 including the simplified buffer units 12 by some OHT transport vehicles 10 having the ID read/write unit 25, management may be carried out through the MCS 4 by performing the reading and writing of the ID card 20.

In addition, in the automated material handling system 1 in accordance with this embodiment, although the ID card (identification information recording unit) 20 for recording the carrier ID, i.e., identification information, is used as the identification information recording unit for recording the identification information to identify each carrier, the identification information recording unit is not limited to the same. For example, a barcode may also be used as the identification information recording unit. In such a case, a barcode read/write unit is used as the identification information read/write unit.

Although the invention has been described in detail and with reference to the specific embodiment, it will be apparent to those skilled in the art that various changes and modifications may be made thereto without departing from the spirit and scope of the invention.

This application is based on Japanese Patent Application filed on Mar. 28, 2005 (Japanese Patent Application No. 2005-91673), the contents of which are incorporated herein by reference.

INDUSTRIAL APPLICABILITY

According to the automated material handling system in accordance with the invention, the identification information read/write unit, which performs on the basis of a command of the controller the reading and writing of identification information on or from the identification information recording unit mounted on an object to be transported, is mounted only on some transport vehicles. Therefore, a marked cost reduction is achieved in comparison with the conventional case where the identification information read/write unit is mounted in all of the manufacturing apparatuses and the storage units. In addition, since the identification information read/write unit is mounted in the transport vehicle, the transport vehicle is able to read and write the identification information while performing the usual transporting operation, so that the objects to be transported can be managed easily. Furthermore, the transport vehicle excels in mobility with respect to the manufacturing apparatuses and the storage units and readily ensures communication between the identification information read/write unit mounted in the transport vehicle and the identification information recording unit mounted on the object to be transported, thereby making it possible to manage the objects to be transported with high reliability.

The invention claimed is:

1. An automated material handling system for managing objects to be transported which are transported between at least one of a plurality of storage units and a plurality of manufacturing apparatuses by a plurality of transport vehicles in accordance with a command of a controller, wherein the object to be transported has a readable/writable identification information recording unit for recording identification information for identifying an object to be processed which is accommodated in the object to be transported;

at least some of the plurality of transport vehicles have an identification information read/write unit for effecting the reading and writing of the identification information with respect to the identification information recording unit based on the command of the controller and position information of the object to be transported, which is recorded in the controller;

the controller has an identification information management unit for storing and managing the identification information which has been read or written in the identification information read/write unit;

the management of the object to be processed is performed in the controller based on the identification information recorded on the identification information recording unit and the identification information stored in and managed by the identification information management unit;

each of the plurality of storage units includes a stocker and a simplified buffer unit for temporarily storing the object to be transported;

at least some of the plurality of manufacturing apparatuses and at least some of the stockers are provided with another identification information read/write unit;

the controller further has an identification information confirmation unit for confirming whether or not the identification information read by the identification information read/write unit and the identification information stored in and managed by the identification information management unit match; and the identification information read/write unit reads the identification information from the identification information recording unit at a time of performing the carrying in and out of the object to be transported with respect to a portion of the plurality of storage units and a portion of the plurality of manufacturing apparatuses which are not provided with the identification information read/write unit.

2. The automated material handling system according to claim 1, wherein, when it is determined in the identification information confirmation unit that the identification information read by the identification information read/write unit and the identification information stored in and managed by the identification information management unit do not match, the controller causes the identification information stored in and managed by the identification information management unit to be rewritten into the identification information read by the identification information read/write unit, or rearranges the object to be transported so as to match the identification information stored in and managed by the identification information management unit.

* * * * *